(12) United States Patent
Sharon et al.

(10) Patent No.: US 11,481,271 B2
(45) Date of Patent: Oct. 25, 2022

(54) STORAGE SYSTEM AND METHOD FOR USING SUBCODES AND CONVOLUTIONAL-BASED LDPC INTERLEAVED CODING SCHEMES WITH READ THRESHOLD CALIBRATION SUPPORT

(71) Applicant: Western Digital Technologies, Inc., San Jose, CA (US)

(72) Inventors: Eran Sharon, Rishon Lezion (IL); Idan Goldenberg, Ramat Hasharon (IL); Idan Alrod, Herzeliya (IL); Ran Zamir, Ramat Gan (IL); Alexander Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 36 days.

(21) Appl. No.: 17/202,601

(22) Filed: Mar. 16, 2021

(65) Prior Publication Data

US 2022/0300369 A1 Sep. 22, 2022

(51) Int. Cl.
| | | |
|---|---|---|
| *G11C 29/00* | (2006.01) | |
| *G06F 11/00* | (2006.01) | |
| *G06F 11/10* | (2006.01) | |
| *G06F 12/0882* | (2016.01) | |
| *G06F 11/07* | (2006.01) | |

(52) U.S. Cl.
CPC ........ *G06F 11/1044* (2013.01); *G06F 11/076* (2013.01); *G06F 11/104* (2013.01); *G06F 12/0882* (2013.01)

(58) Field of Classification Search
CPC .. G06F 11/1044; G06F 11/076; G06F 11/104; G06F 11/1048; G06F 11/1068; G06F 11/1072; G06F 12/0882; G06F 12/0802
See application file for complete search history.

(56) References Cited

U.S. PATENT DOCUMENTS

| | | | |
|---|---|---|---|
| 7,681,109 | B2 | 3/2010 | Litsyn et al. |
| 7,844,877 | B2 | 11/2010 | Litsyn et al. |
| 7,917,829 | B2 | 3/2011 | Livshitz |
| 8,291,279 | B2 | 10/2012 | Sharon et al. |
| 9,697,905 | B2 | 7/2017 | Sharon et al. |

(Continued)

FOREIGN PATENT DOCUMENTS

| | | |
|---|---|---|
| JP | 2014523595 A | 9/2014 |
| JP | 2019169216 A | 10/2019 |
| JP | 2020202553 A | 12/2020 |

OTHER PUBLICATIONS

Felstrom, A.J. et al.; "Time-Varying Periodic Convolutional Codes With Low-Density Parity-Check Matrix"; IEEE Transactions on Information Theory, vol. 45, No. 6; Sep. 1999; pp. 2181-2191.

(Continued)

*Primary Examiner* — Christine T. Tu
(74) *Attorney, Agent, or Firm* — Crowell & Moring LLP

(57) ABSTRACT

A storage system generates a low-density parity check (LDPC) code from a plurality of subcodes. The storage system stores each subcode in a different page of a word line in the memory. The subcode can be stored in one plane in the memory or across multiple planes. When the subcodes are stored across multiple planes, they can be stored in a checkboard pattern.

21 Claims, 12 Drawing Sheets

(56) References Cited

U.S. PATENT DOCUMENTS

| | | |
|---|---|---|
| 10,063,258 B2 | 8/2018 | Goldenberg et al. |
| 10,367,528 B2 | 7/2019 | Goldenberg et al. |
| 2013/0318422 A1 | 11/2013 | Weathers et al. |
| 2015/0169465 A1* | 6/2015 | Slepon ............... G06F 12/1009 711/103 |
| 2017/0097869 A1* | 4/2017 | Sharon ............... G06F 11/1072 |
| 2017/0272102 A1 | 9/2017 | Goldenberg et al. |
| 2018/0269900 A1 | 9/2018 | Fan et al. |
| 2019/0026227 A1* | 1/2019 | Yeh ..................... G06F 12/0607 |
| 2019/0188078 A1* | 6/2019 | Yu ..................... H03M 13/1154 |
| 2020/0183776 A1* | 6/2020 | Lee ........................ G06F 11/08 |

OTHER PUBLICATIONS

Iyengar, A.R. et al.; "Windowed Decoding of Spatially Coupled Codes"; IEEE Transactions on Information Theory; 2012; 16 pages.

Kudekar, S. et al.; "Threshold Saturation via Spatial Coupling: Why Convolutional LDPC Ensembles Perform So Well over the Bec"; IEEE Transactions on Information Theory; 2011; 29 pages.

"Low-density parity-check code"; Wikipedia entry; downloaded from the Internet at https://en.wikipedia.org/wiki/Low-density_parity-check_code on Feb. 15, 2021; 8 pages.

\* cited by examiner

STORAGE SYSTEM AND METHOD FOR USING SUBCODES AND CONVOLUTIONAL-BASED LDPC INTERLEAVED CODING SCHEMES WITH READ THRESHOLD CALIBRATION SUPPORT

BACKGROUND

Low-cost memories are desired for cold storage products. Cold storage products typically have relaxed specifications in terms of endurance and data retention and reduced performance requirements (i.e., lower write/read performance). In order to achieve significant memory cost reduction, logical scaling can be used to store more information per memory cell by increasing the number of programming states and/or reducing the error correction code (ECC) redundancy, both of which degrade the ECC performance either by introducing more errors (e.g., more states per cell) or by weakening the code.

BRIEF DESCRIPTION OF THE DRAWINGS

FIGS. 6A and 6B are diagrams illustrating a checkerboard interleaving scheme of an embodiment that occurs over four planes.

DETAILED DESCRIPTION

The following embodiments are generally related to a storage system and method for using subcodes and convolutional-based low-density parity check (LDPC) interleaved coding schemes with read threshold calibration support. In one embodiment, a storage system is provided comprising a memory and a controller coupled to the memory. The controller is configured to generate a low-density parity check (LDPC) code from a plurality of subcodes; and store each subcode of the plurality of subcodes in a different page of a word line in the memory. In another embodiment, a method is provided that is performed in a storage system. The method comprises generating a convolutional low-density parity check (CLDPC) code and storing different portions of the CLDPC code in different pages of a word line in the memory. In yet another embodiment, a storage system is provided comprising a memory, means for generating a low-density parity check (LDPC) code from a plurality of subcodes, and means for storing each subcode of the plurality of subcodes in a different page of a word line in the memory. Other embodiments are provided, and each of these embodiments can be used alone or in combination.

Figure 1A:
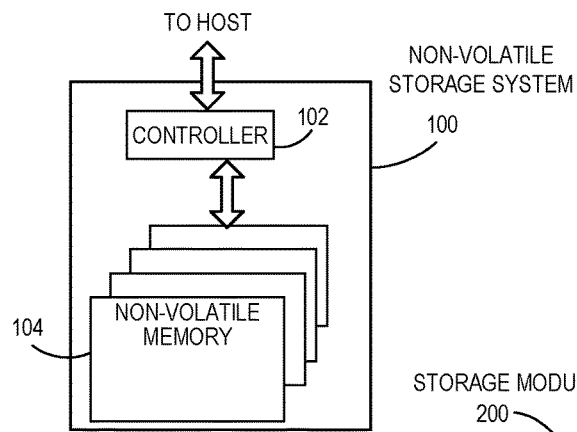
FIG. 1A is a block diagram of a non-volatile storage system of an embodiment.
Figure 1B:
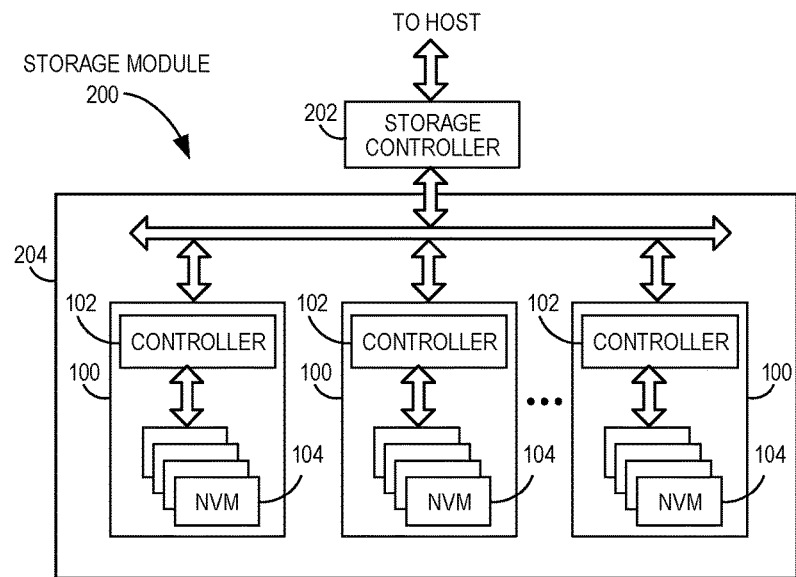
FIG. 1B is a block diagram illustrating a storage module of an embodiment.
Figure 1C:
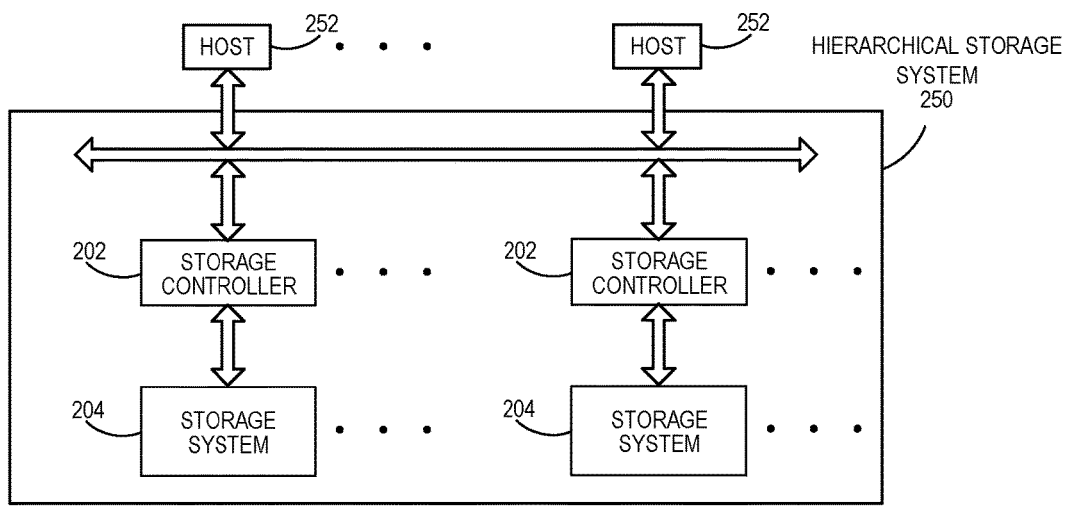
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
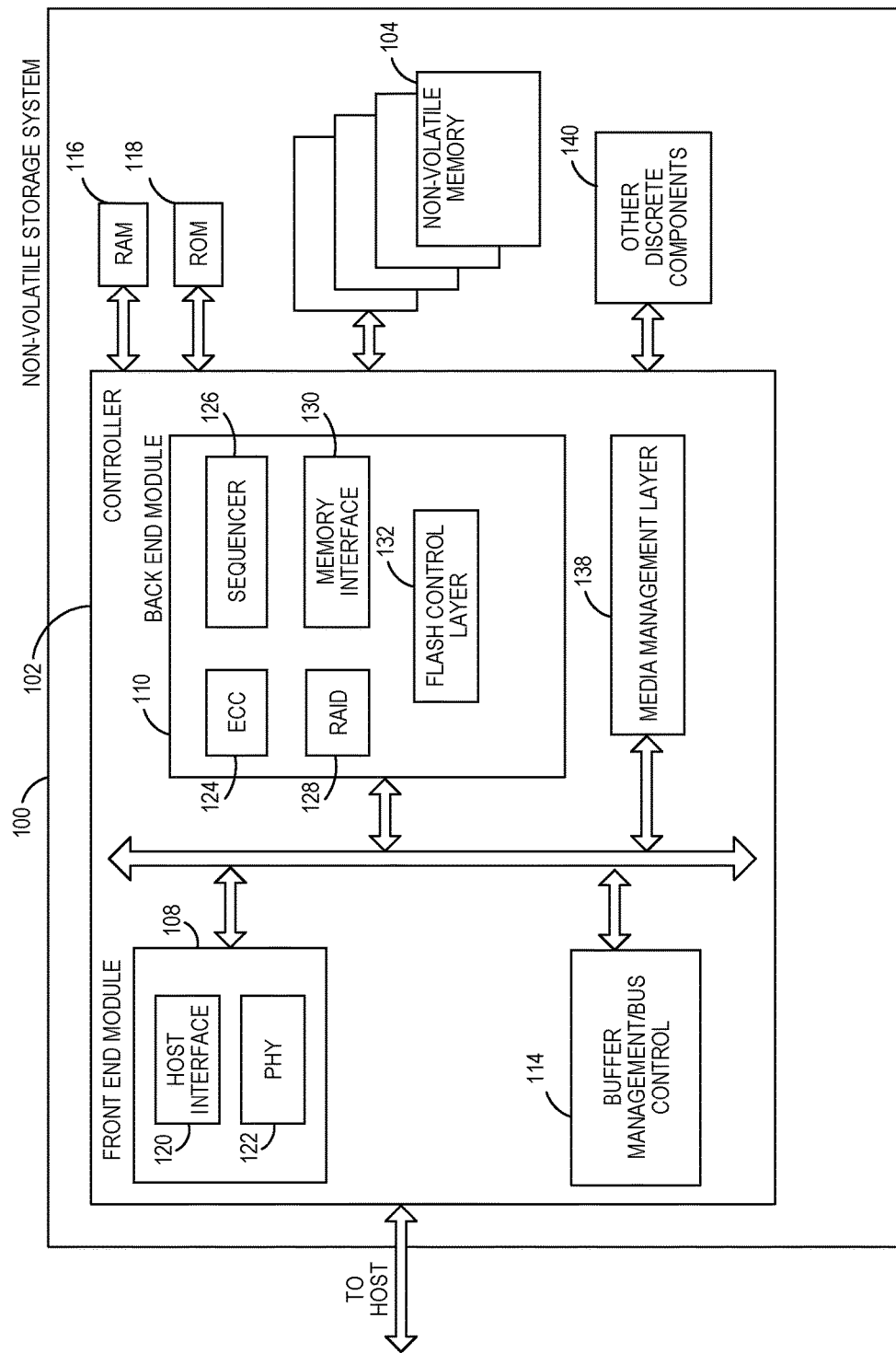
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
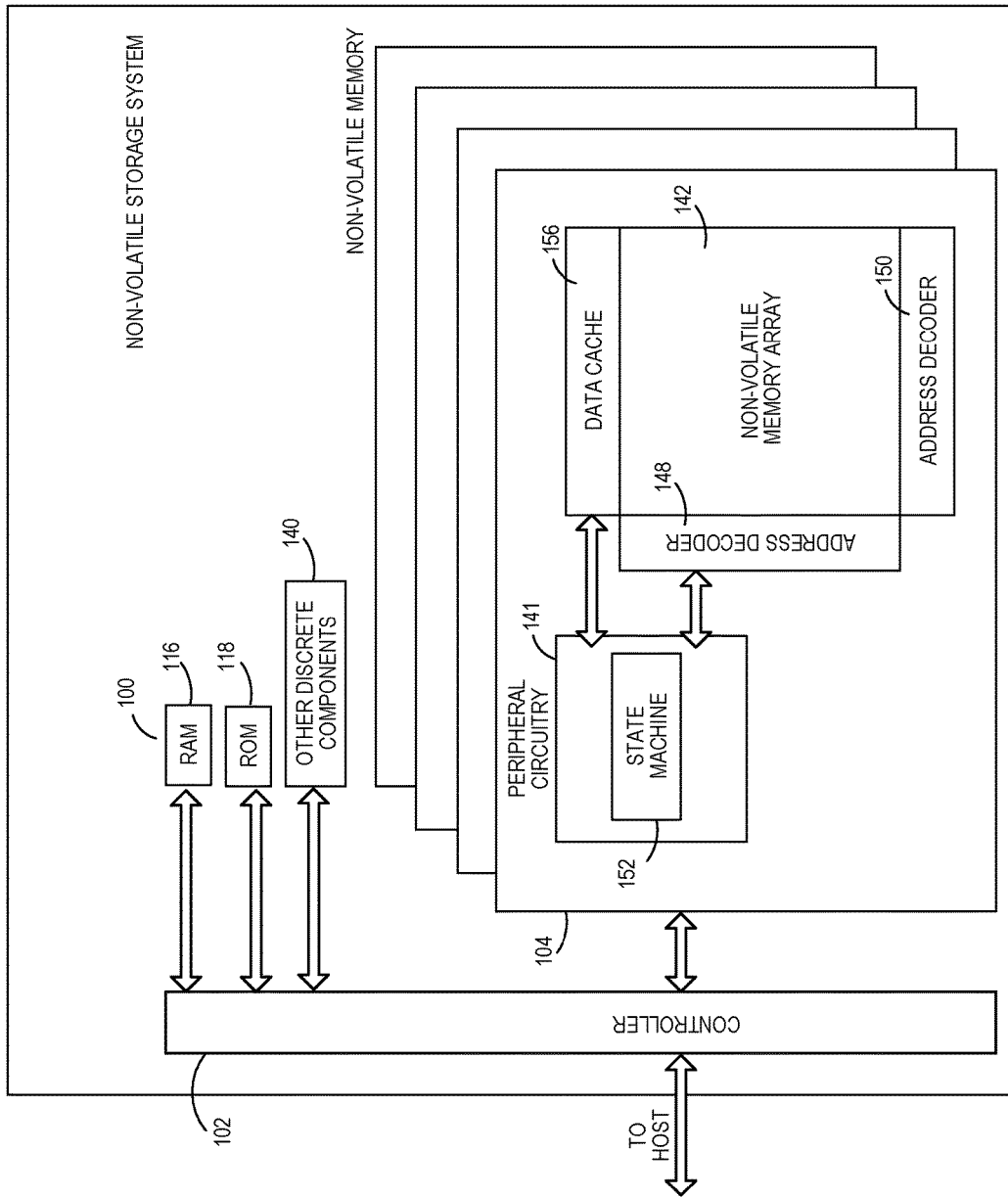
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
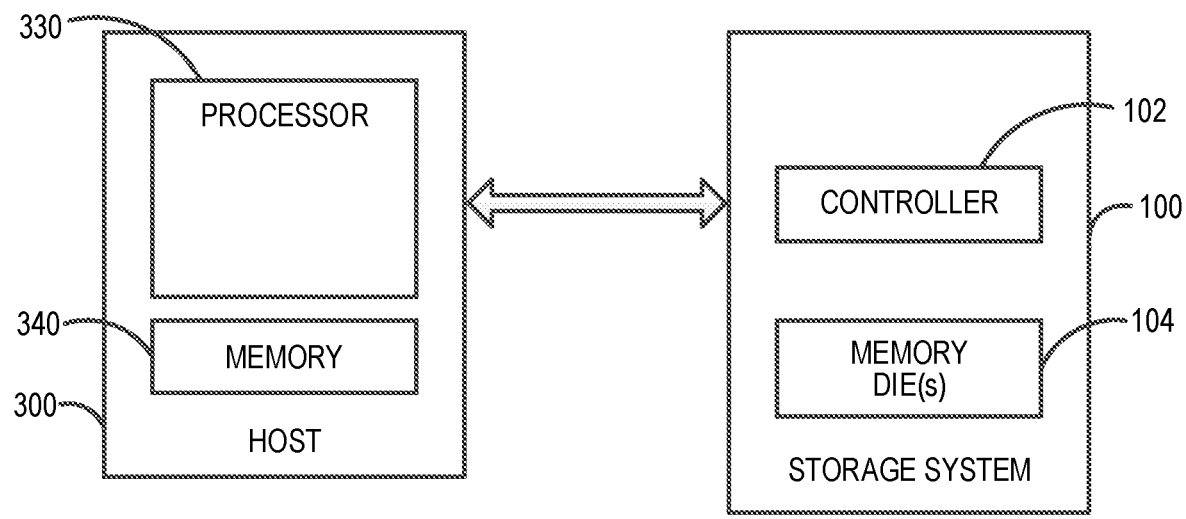
FIG. 3 is a diagram of a host and a storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340) to the storage system 100 for storage in the storage system's memory 104.

Errors can occur in the storage of data, and the storage system 100 can use an error detection/correction scheme to address such errors. For example, a low-density parity check (LDPC) code can be used. An LPDC code can be represented by a bipartite/Tanner graph. One set of nodes (the variable or bit nodes) correspond to elements of the codeword, and the other set of nodes (check nodes) correspond to the set of parity check constraints satisfied by the codewords. The edge connections can be chosen at random. So, N symbol nodes in the graph can correspond to bits of the codeword, and M check nodes can correspond to a set of parity check constraints that define the code. Edges in the graph connect symbol nodes to check nodes. A parity check matrix H of size M×N can be used to specify LDPC codes, where each column can correspond to a symbol node and each row can correspond to a check node. The matrix defines an LDPC block code (N, K), where K is the information block size, N is the length of the codeword, and M is the number of parity check bits (M=N—K). LDPC allows a noise threshold to be set close to the theoretical maximum (the Shannon limit).

The following patent applications discuss LDPC, and the embodiments disclosed therein can be used with these embodiment disclosed herein: Ser. Nos. 15/265,045; 15/617,059; 15/179,069; and 14/561,084.

As discussed in some of those patent applications, sub-codes-based LDPC can be used as a way to reduce LDPC engine complexity. However, subcode-based LDPC solutions were typically non-interleaved, such that the entire "super code" resides in a single physical page. In addition, such solutions are typically based on relatively-short LDPC codes of two or four KB. Some of those patent applications also discuss convolutional-based LDPC.

With the significant increase in cloud storage capacity over the last decade, utilizing low-cost memories for storage of "cold" data is becoming highly desirable. The cold storage products will have relaxed specifications in terms of endurance and data retention and reduced performance requirements (i.e., lower write/read performance). In order to achieve significant memory cost reduction, logical scaling can be used to store more information per cell by increasing the number of programming states and/or reducing the error correction code (ECC) redundancy, both of which degrade the ECC performance either by introducing more errors (e.g., more states per cell) or by weakening the code. This introduces a challenge in maintaining the reliability of the storage system (sometimes referred to herein as the storage device).

To enable such logical scaling, improved coding schemes are needed. Two such improved coding schemes are interleaved coding and using longer LDPC codes. However, these two schemes have their downsides.

Interleaved coding spans the codeword across physical pages, such that ECC needs to handle an average bit error rate (BER) across pages, as opposed to the worst page BER (as in non-interleaved coding approaches). However, there are several downsides to this interleaving scheme. For example, interleaved coding can lead to degraded random read performance because reading a single 4 KB flash memory unit (FMU) requires sensing all pages of the word line (e.g., four pages for X4 memory having 16 programming states or five pages for X5 memory having 32 programming states), as opposed to a single page in conventional non-interleaved coding. Another downside is that interleaved coding requires significantly more-complicated ECC-based calibration of read thresholds. One preferred scheme used for calibrating read thresholds is BER Estimation Scan (BES), where BER is estimated (via computing the syndrome weight (SW) of the codeword) for each possible set of read thresholds, and the set providing the minimal BER estimation is selected as the optimal read threshold. The issue is that the complexity of the BES algorithm grows exponentially with the number of read thresholds that are involved in reading a single codeword. If we want to scan n read levels per threshold, the number of options that needs to be evaluated is $n^{(\#read\ thresholds\ per\ codeword)}$. For example, consider X4 memory with 3444 mapping. I.e. the first logical page has 3 logical transitions (→requiring 3 read thresholds), the second logical page involves 4 logical transitions (→4 read thresholds), etc. In a non-interleaved coding scheme, the maximum number of read thresholds involved in reading a codeword is four; hence, the BES complexity is $n^4$. In an interleaved coding scheme, the number of thresholds involved in reading a codeword is 15 (=3+4+4+4); hence the BES complexity is n^15, which is no longer feasible.

Another downside with the interleaving scheme is that it presents challenges in Memory Error Model (MEM) estimation and corresponding log likelihood ratio (LLR) table calibration. In an interleaved coding scheme where the codeword is spanned across all the physical pages of a word line, the codeword is affected by the full MEM of the word line. As an example, for X4 memory, assuming reading a word line with a read resolution of five senses per read threshold, the MEM involves estimation of the error rate for (#read thresholds per word line)×(#senses per thresholds)=15×5=75 voltage bins. This is significantly higher than what we need to do for non-interleaved coding, where we need to estimate, at most, six voltage bins. As we need to estimate more parameters, the estimation quality will be lower. In addition, hardware complexity increases.

So, in spite of its advantage in terms of BER averaging, which considerably relaxes the ECC requirement, non-interleaved coding is typically used due to the significantly-degraded random read performance of interleaved coding (e.g., reading a single logical page (or a single 4 KB flash memory unit (FMU)) may require reading (sensing & transferring) all the physical pages of the word line).

Regarding the longer LDPC code scheme, using longer LDPC codes (e.g., 8 KB/16 KB/32 KB/64 KB) allows for operating close to the Shannon limit, which provides higher coding efficiency and higher correction capability. However, the downside to this scheme is that LDPC memory complexity is proportional to the code length. Hence, a 16 KB/32 KB/64 KB LDPC will require X4/X8/X16 memory size.

The following embodiments provide coding schemes that can be used to solve the above issues and still enjoy the benefits of interleaved coding and long LDPC codes. One embodiment is based on LDPC subcodes, and the second is based on convolutional LDPC codes. Both embodiments can be implemented in the controller 102 of the storage system 100 and may find particular use when the storage system 100 is used for cold storage. Examples of these embodiments are provided below. It is important to note that these are merely examples and other implementations can be used.

Figure 4:
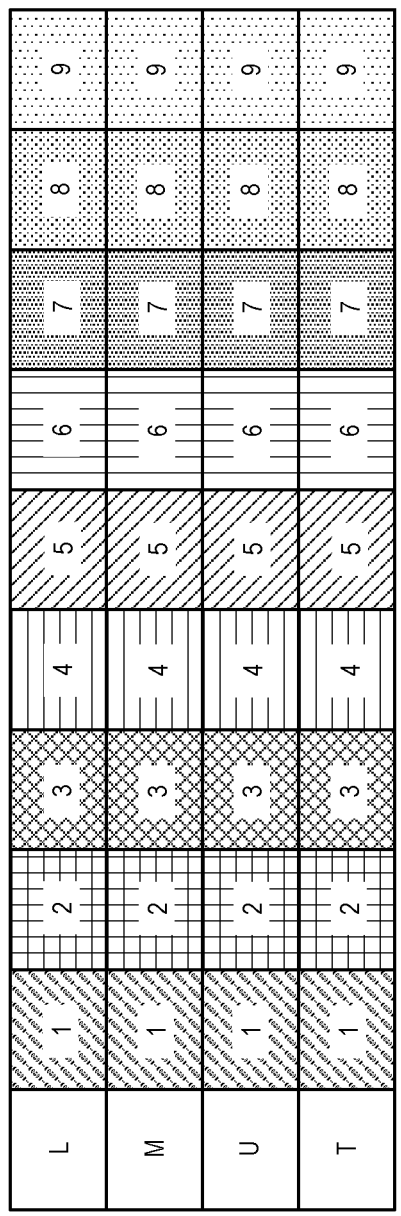
FIG. 4 is a diagram illustrating a vertical interleaving scheme of an embodiment.
Figure 5:
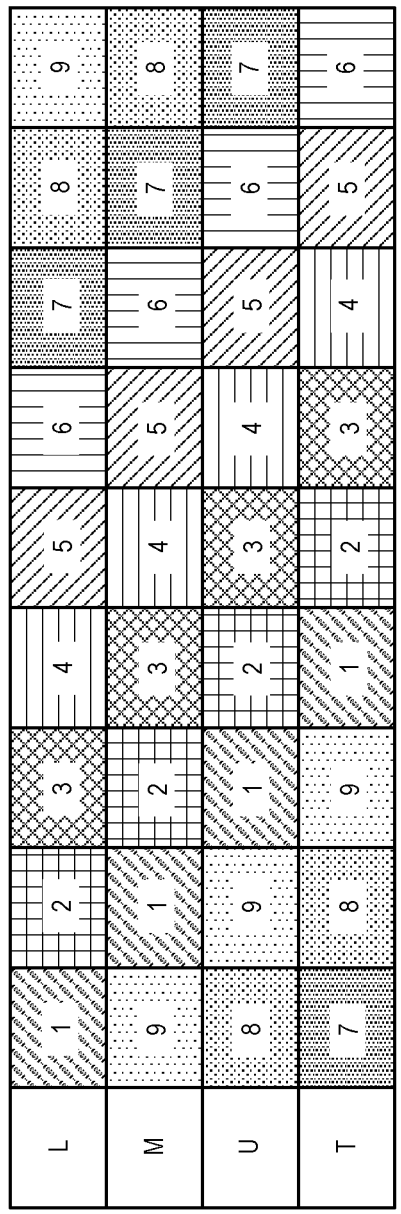
FIG. 5 is a diagram illustrating a checkerboard interleaving scheme of an embodiment.

Turning first to the embodiment based on LDPC subcodes, this embodiment constructs long LDPC codes from t subcodes connected with a small number of global parity bits, where each subcode resides on a different physical page of a word line and/or in different planes. For example, a 16 KB LDPC may be constructed from 4×4 KB subcodes, each one stored in a different physical page of an X4 word line, potentially also on different planes (e.g., in a checkerboard manner). FIGS. 4 and 5 provide illustrations of these examples. In FIG. 4, subcode 1 is stored in the lower (L) page, subcode 2 is stored in the middle (M) page, subcode 3 is stored in the upper (U) page, and subcode 4 is stored in the top (T) page. FIG. 4 shows that these subcodes are stored in a vertical manner; however, the subcodes can be stored in a different manner, such as in an checkerboard interleaving manner, as illustrated in FIG. 5.

Figure 6A:
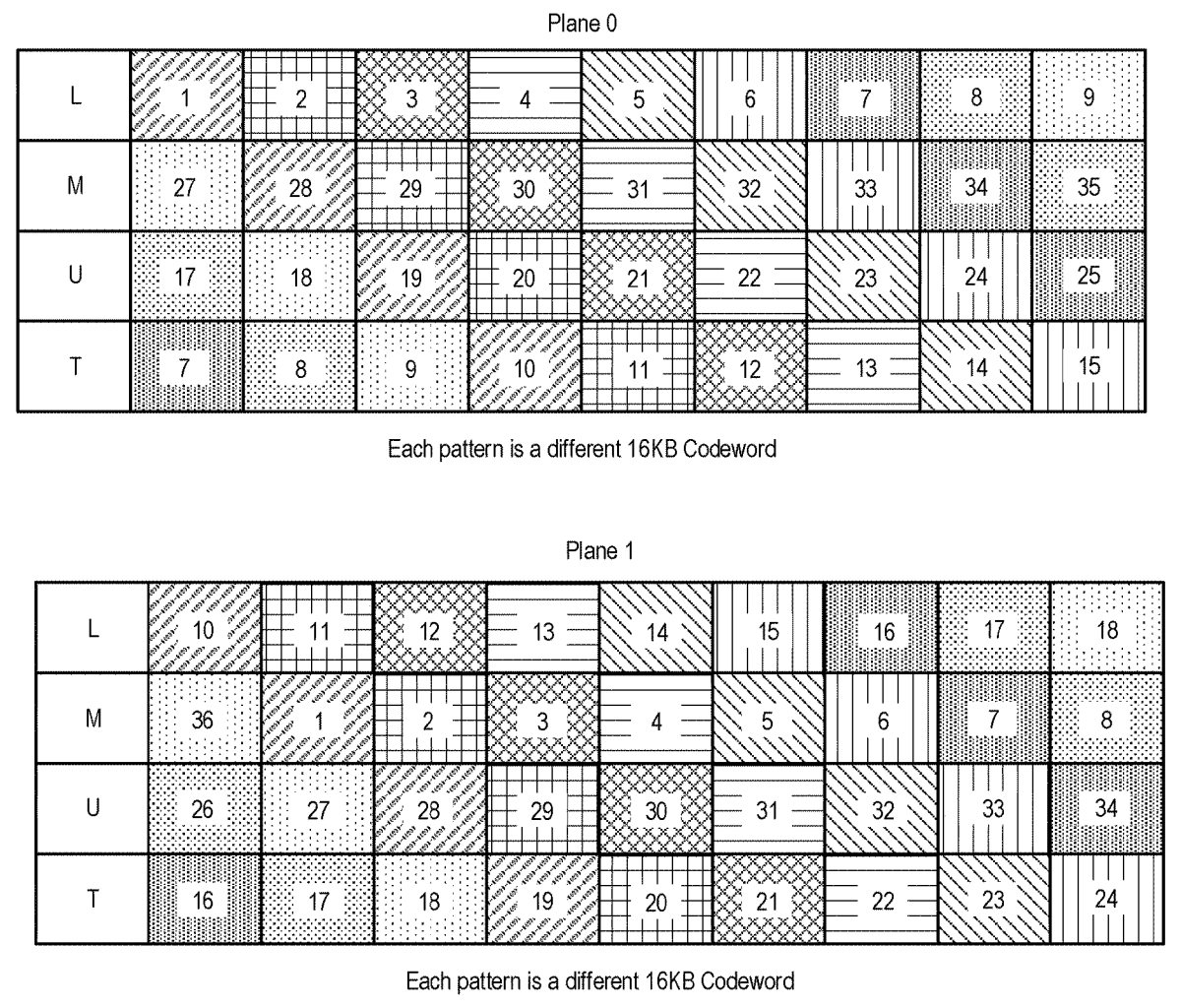
Figure 6B:
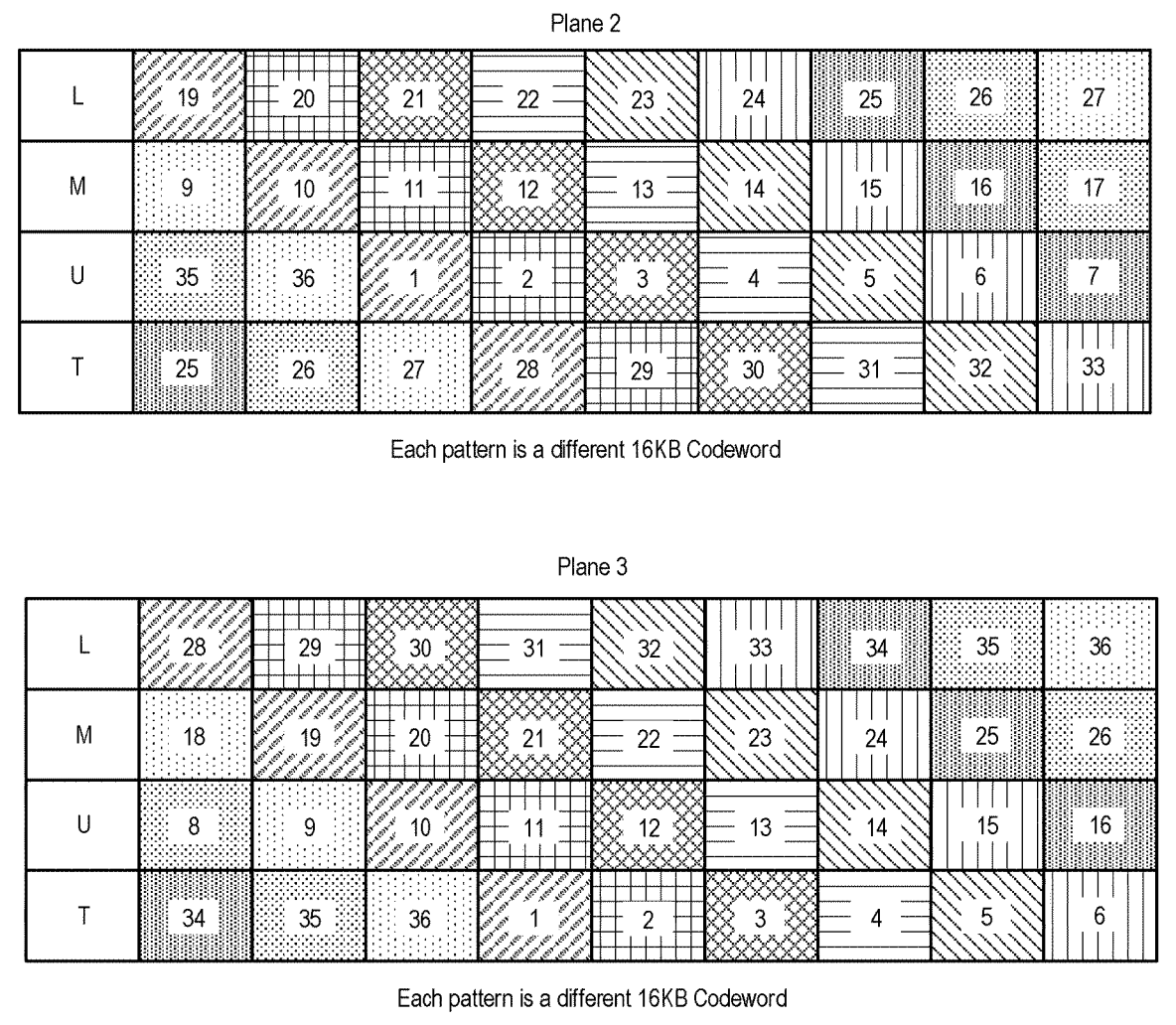

FIGS. 6A and 6B are diagrams illustrating a checkerboard interleaving scheme of an embodiment that occurs over four planes. Subcode 1 is stored in the L page—plane 0, subcode 2 is stored in the M page—plane 1, subcode 3 is stored in the U page—plane 3, and subcode 4 is stored in the T page—plane 4 in a checkerboard interleaving manner across planes.

These embodiments can be used to solve the problems mentioned above, as well as provide additional benefits. One benefit is that these embodiments can reduce sensitivity to page BER variations (as with interleaved coding schemes), as the subcode stored on the worst page (which may be different for different operational conditions) gets assistance from the other subcodes stored on the other pages through joint global parity. Another benefit is that these embodiments can provide good random read performance (as with non-interleaved coding schemes). For example, most of the time, these embodiments can read and decode a single (e.g., 4 KB) subcode, requiring sensing and transferring only a single page. Only in rare cases of high BER will these embodiments need to read all pages and decode the full (e.g., 16 KB) code. As additional benefits, these embodiments can provide improved correction capability corresponding to a conventional long LDPC code solution and use a small silicon footprint of the LDPC engine (corresponding to a 4 KB LDPC solution) due to using subcodes. Another benefit is that these embodiments provide a simple BES-based read thresholds calibration solution (as with non-interleaved coding solutions). In this way, calibrating the read thresholds on each physical page can be done by applying BES on that page using the appropriate subcode stored on that page, thereby breaking the full problem of calibrating all the read thresholds of the word line into simpler sub-problems. Similarly, these embodiments can provide a simple scheme for estimating the MEM and using it for calibrating decoder and/or system parameters (such as a-priori LLRs), as may be used in a non-interleaved coding solution, by applying the estimating at the subcode level and estimating the MEM of the specific page corresponding to the subcode, thereby breaking the full problem of estimating MEM per word line into a simpler sub-problems.

Figure 7:
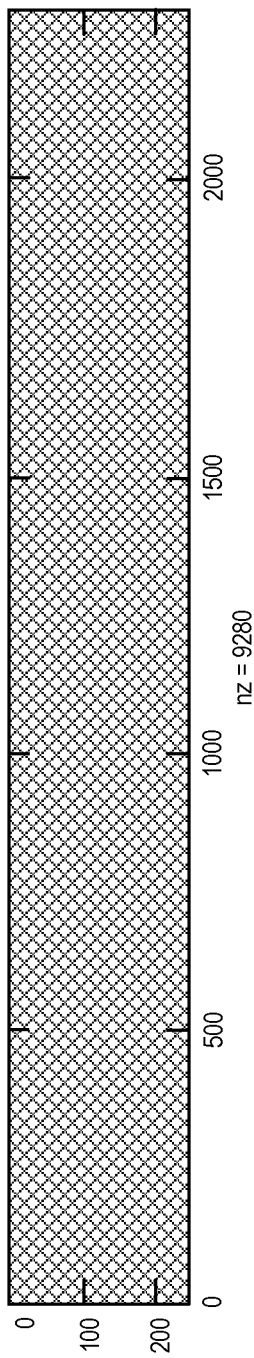
FIG. 7 is a graph of a parity-check matrix of low-density parity check (LDPC) codes of an embodiment.
Figure 8:
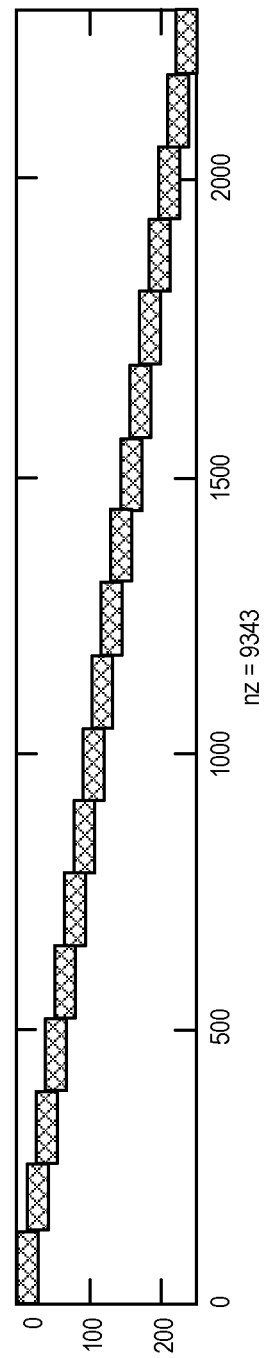
FIG. 8 is a graph of a parity-check matrix of convolutional-based low-density parity check (CLDPC) codes of an embodiment.

In another embodiment, a convolutional LDPC code (CLDPC)-based scheme is used. Convolutional LDPC codes combine properties of classic convolutional codes with those of LDPC codes. These codes have been demonstrated to have better decoding thresholds (correction capability) than standard LDPC codes. Unlike standard LDPC, which have a parity-check matrix with a random-like structure (see FIG. 7), CLDPC codes are characterized by a parity-check matrix having a staircase-like pattern (see FIG. 8).

From a practical standpoint, some key properties that are examined initially in any LDPC construction (and, in particular, CLDPC constructions) are the variable node degree distribution $d_v$ and the check node degree distribution $d_c$. The variable and check node degree distributions play a key role in the ability to create codes with high correction capability. In addition, the variable degree distribution in itself determines the ability to operate with a low-power, high-throughput decoder characterized by lower correction capability. Experiments have shown that for flash-based areas of interest (in terms of code rate and length), the advantage of CLDPC codes over standard LDPC codes (or subcodes-based LDPC) in terms of correction capability increases with the block length, and reaches saturation for very long block lengths.

Figure 9:
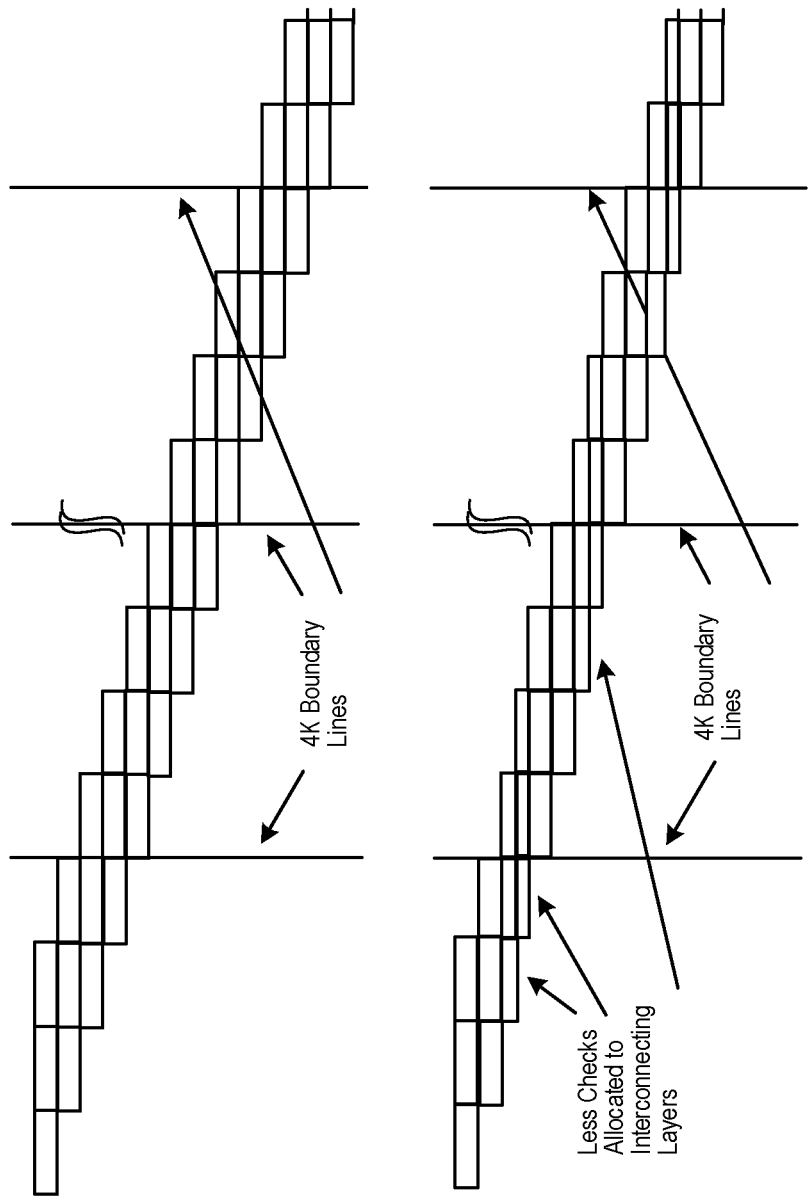
FIG. 9 is an illustration of bird's eye views of a parity check matrix with and without a number of interconnecting checks reduced.

The ability to perform random read may be supported by CLDPC codes due the inherent locality of their structure. This is illustrated in FIG. 9, where the boundaries of the 4 K code chunks represent a limitation to the operation of the CLDPC code in a random read. Since a parity check cannot be used unless information is obtained from all its variables, all parity checks in the interconnecting region are not usable and cannot contribute to the correction capability. To mitigate this phenomenon and increase both throughput correction capability of the random read operation, the connecting check layers can be shrunk, as shown in the bottom portion of FIG. 9. This technique is discussed in more detail in U.S.

Pat. No. 10,389,389. The more the connecting layers are shrunk, the better performance and correction capability one can achieve for random read. However, this comes at the expense of performance and correction capability of the full-length read.

A similar tradeoff exists for the subcodes-based scheme in determining the amount of joint parity. When the joint parity size is very small, the overall correction capability approaches that of the single subcode at the benefit of better performance at the subcode level. When the joint parity is large, the overall correction capability increases at the expense of worse performance at the subcode level.

Referring again to FIG. 9, the top portion of FIG. 9 shows a bird's eye view of a parity check matrix for a 32 K CLDPC code, divided into 4 K sections. As shown in FIG. 9, only the two left-most and two right-most 4 K chunks are shown. The bottom portion of FIG. 9 shows the same CLDPC matrix but where the number of interconnecting checks is reduced at the benefit of the non-interconnecting checks. This creates a tradeoff between 4 K and 32 K in terms of performance and correction capability. The different 4 K chunks of the CLDPC code may be stored using either vertical interleaving or checkerboard interleaving, in a manner similar to the subcodes based solution.

There are many benefits associated with the embodiments that provide a CLDPC-based system. One benefit is that these embodiments have reduced sensitivity to page BER variations (as with interleaved coding schemes). The chunk on the worst logical page is assisted by the other chunks stored on the other pages through the joint global parity. As another benefit, these embodiments provide good random read performance (as with non-interleaved coding schemes). Most of the time, these embodiments can sense and transfer only a single page containing a single chunk. Only in rare cases of high BER may these embodiments need to read all pages and decode the full code. These embodiments also provide improved correction capability (assuming the code length is sufficiently long) and a small silicon footprint of the LDPC engine (a smaller four-K-like silicon footprint can be achievable in windowed decoding, although this will come with some hit to performance and correction capability). As another advantage, these embodiments provide a simple BES-based read thresholds calibration solution (as with existing non-interleaved coding solutions). As with the subcode-based scheme, BES may be applied only on a single chunk contained on one logical page, thereby breaking the full problem of estimating read thresholds per word line into simpler sub-problems. Similarly, these embodiments can provide a simple solution for estimating the MEM and using it for calibrating decoder and system parameters (such as a-priori LLRs), as with conventional non-interleaved coding solutions, by applying the estimation at the chunk level to estimate the MEM of the corresponding page, thereby breaking the full problem of estimating MEM per word line into simpler sub-problems.

Independent of the subcodes/CLDPC schemes, one of the main issues with conventional interleaved coding is that it significantly complicates ECC-based read thresholds calibration (e.g., BER Estimation Scan (BES)). Additional solutions can be used to address this. One additional solution uses a combination of histograms and BES. In this solution, a high resolution read of the word line, sensing at n Vts around each of the word line's M read thresholds (e.g. M=15 for an X4 memory), in order to generate a histogram of cell count per Vt bin, and a valley search is performed on the histogram to find the M valley locations, which will be used as "initial guesses" for the BES algorithm. The BES can be done by iteratively performing the following procedure for each read threshold j=1-M: fixing all other M-1 thresholds (i~=j) on current "best guess" and scanning the j'th threshold for minimal BER/SW, and then updating the j'th threshold "best guess" to the read level which minimized SW. This is repeated iteratively until there are no more changes in the found read thresholds.

This procedure allows read threshold calibration to be performed on the entire super code (instead of subcode/CLDPC chunk), which spans across all the physical pages (e.g., spans across 15 thresholds for X4 memory), however, with complexity that is linear in the number of read thresholds and not exponential. More specifically, assuming we want to scan a window with n (=5, 7, . . . ) read level options around each threshold, instead of performing an exhaustive scan of all $n^M$ combinations (which is not practical), each threshold is scanned separately, while fixing the other thresholds on the current "best guess," which can be updated iteratively, leading to a linear complexity of $M*n$. The feasibility of this approach requires that the initial guess will not be too far off (such that the BER will not be too high, resulting in SW being saturated, providing no gradient signal for read level correction). This is achieved by introducing the initial step of generating an initial guess based on minima points of the cell count per Vt bin histogram. The proposed iterative scheme will have linear complexity in n—that is $I*M*n$, where I is the number of iterations (which is expected to be low, e.g. ~2).

Another approach uses a combination of interleaved coding and non-interleaved coding. In each word line, or in each word line zone, or in each block, one codeword in stored on a non-interleaved coding format, while all other codewords are stored in interleaved coding format. The non-interleaved codeword is used for read threshold calibration through conventional BES. In order to compensate for the higher BER of the non-interleaved codewords, higher redundancy may be used for these codewords.

Figure 10:
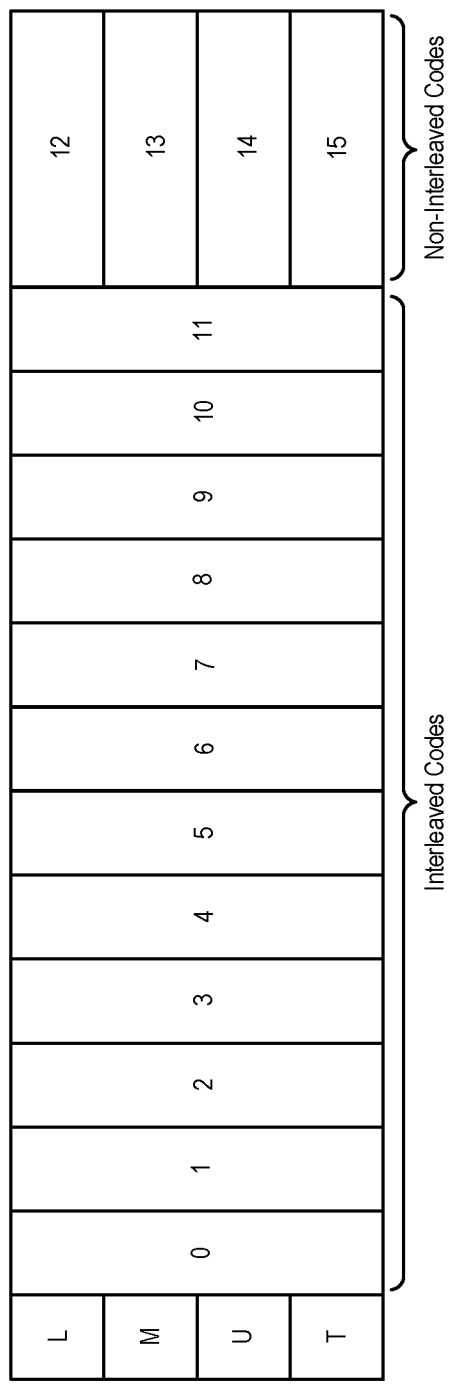
FIG. 10 is an illustration of an embodiment using a hybrid interleaved/non-interleaved coding method.

In one example implementation, there is one non-interleaved word line in a block. This is illustrated in FIG. 10, which shows vertical interleaving over four planes with one non-interleaved word line codeword per page (the same scheme can also be applied to checkerboard interleaving). In this case, read threshold calibration may be conducted on the word line that is non-interleaved and calibrated read thresholds inferred for all the other word lines from the non-interleaved one. Since the interleaved codewords have a better reliability due to the interleaving, we can assign more redundancy to the non-interleaved code-words to compensate for the reduced reliability. This is possible as there is correlation between the word lines of the same blocks. Alternatively, different blocks may contain different non-interleaved word line numbers so that corresponding word line number read thresholds may also be inferred from other blocks' word line numbers. This process uses representative blocks and word line numbers that provide calibration results used across other blocks of the device.

Figure 11:
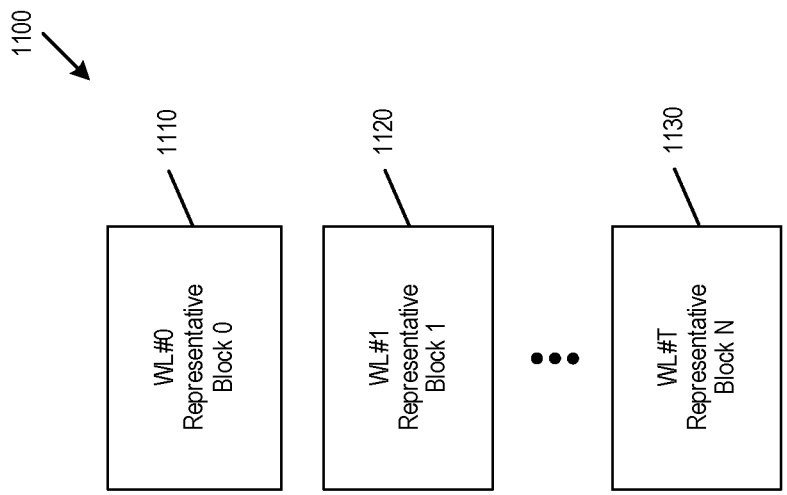
FIG. 11 is an illustration of an embodiment using non-interleaved word lines on representative blocks.

FIG. 11 shows how one word line may be non-interleaved on each representative block so that, overall, all word lines have equal representation and can be calibrated in the proposed manner. There are usually fewer word lines (e.g., around a hundred) than blocks (e.g., thousands), so that there should be no lack of blocks.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A storage system comprising:
a memory; and
a controller coupled to the memory and configured to:
store each subcode of a plurality of subcodes in a different page of a word line in the memory; and
generate a low-density parity check (LDPC) code from the plurality of subcodes stored in the different pages of the word line in the memory.

2. The storage system of claim 1, wherein the plurality of subcodes are stored in a same plane in the memory.

3. The storage system of claim 1, wherein the plurality of subcodes are stored in different planes in the memory.

4. The storage system of claim 3, wherein the plurality of subcodes are stored in a checkerboard pattern in the different planes in the memory.

5. The storage system of claim 1, wherein the controller is further configured to calibrate a read threshold for a page of the memory.

6. The storage system of claim 5, wherein the calibration is done using a subcode stored on the page being calibrated, and wherein the calibration is done based on subcode bits that are stored on the page and a set of parity check equations that involve solely the subcode bits.

7. The storage system of claim 5, wherein the calibration is done using a histogram.

8. The storage system of claim 1, wherein the controller is further configured to store interleaved codewords and non-interleaved codewords in the memory.

9. The storage system of claim 8, wherein the interleaved codewords and the non-interleaved codewords are stored in different word lines, different word line zones, or different blocks in the memory.

10. The storage system of claim 8, wherein the non-interleaved codewords are used for read threshold calibration.

11. The storage system of claim 1, wherein the memory comprises a three-dimensional memory.

12. In a storage system comprising a memory, a method comprising:
generating a convolutional low-density parity check (CLDPC) code; and
storing different portions of the CLDPC code in different pages of a word line in the memory; and
storing interleaved codewords and non-interleaved codewords in the memory, wherein the interleaved codewords and the non-interleaved codewords are stored in different word lines, different word line zones, or different blocks in the memory.

13. The method of claim 12, wherein the different portions of the CLDPC code are stored in a same plane in the memory.

14. The method of claim 12, wherein the different portions of the CLDPC code are stored in different planes in the memory.

15. The method of claim 14, wherein the different portions of the CLDPC code are stored in a checkerboard pattern in the different planes in the memory.

16. The method of claim 12, further comprising calibrating a read threshold for a page of the memory based on a portion of CLDPC code bits that are stored on a calibrated page and based on a set of parity check equations that involve solely the portion of CLDPC code bits.

17. The method of claim 12, further comprising calibrating a read threshold for a page of the memory using a histogram.

18. The method of claim 12, wherein the memory comprises a three-dimensional memory.

19. A storage system comprising:
a memory;
means for storing each subcode of a plurality of subcodes in a different page of a word line in the memory; and
means for generating a low-density parity check (LDPC) code from the plurality of subcodes stored in the different pages of the word line in the memory.

20. The storage system of claim 19, wherein the LDPC code is generated during encoding.

21. The storage system of claim 1, wherein the LDPC code is generated during encoding.

* * * * *